(12) United States Patent
Hiraoka et al.

(10) Patent No.: US 12,063,799 B2
(45) Date of Patent: Aug. 13, 2024

(54) PHOTOELECTRIC CONVERSION FILM, SOLAR CELL USING SAME, AND METHOD FOR PRODUCING PHOTOELECTRIC CONVERSION FILM

(71) Applicant: Panasonic Intellectual Property Management Co., Ltd., Osaka (JP)

(72) Inventors: Maki Hiraoka, Ibaraki (JP); Toru Nakamura, Osaka (JP); Ryuusuke Uchida, Hyogo (JP); Akio Matsushita, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 184 days.

(21) Appl. No.: 17/525,856

(22) Filed: Nov. 12, 2021

(65) Prior Publication Data

US 2022/0077411 A1    Mar. 10, 2022

Related U.S. Application Data

(63) Continuation of application No. PCT/JP2020/006738, filed on Feb. 20, 2020.

(30) Foreign Application Priority Data

May 29, 2019 (JP) ................. 2019-100447

(51) Int. Cl.
*H10K 30/80* (2023.01)
*H01G 9/20* (2006.01)
(Continued)

(52) U.S. Cl.
CPC ........... *H10K 30/80* (2023.02); *H01G 9/2059* (2013.01); *H10K 85/30* (2023.02); *H10K 71/15* (2023.02); *H10K 71/40* (2023.02)

(58) Field of Classification Search
CPC ............................ H10K 30/80; H01G 9/2059
See application file for complete search history.

(56) References Cited

U.S. PATENT DOCUMENTS

2018/0005764 A1\* 1/2018 Jones ................ C25D 3/54
2018/0277608 A1  9/2018 Lifka et al.
(Continued)

FOREIGN PATENT DOCUMENTS

| JP | 2018-535537 | 11/2018 |
|---|---|---|
| WO | 2017/033092 A1 | 3/2017 |
| WO | 2018/123402 A1 | 7/2018 |

OTHER PUBLICATIONS

International Search Report of PCT application No. PCT/JP2020/006738 dated Apr. 21, 2020.
(Continued)

*Primary Examiner* — Lindsey A Buck
(74) *Attorney, Agent, or Firm* — GREENBLUM & BERNSTEIN, P.L.C.

(57) ABSTRACT

The present disclosure provides a photoelectric conversion film having a high light absorption ability and a long carrier life. A photoelectric conversion film of the present disclosure includes a perovskite compound including a monovalent formamidinium cation, a Pb cation and an iodide ion. The film thickness of the photoelectric conversion film is greater than or equal to 1 μm. In the photoelectric conversion film, the ratio of root mean square roughness Rq to the film thickness is less than or equal to 0.13.

7 Claims, 6 Drawing Sheets

(51) Int. Cl.
    H10K 71/15    (2023.01)
    H10K 71/40    (2023.01)
    H10K 85/30    (2023.01)

(56) References Cited

U.S. PATENT DOCUMENTS

2019/0115549 A1   4/2019   Snaith et al.
2019/0173025 A1   6/2019   Uchida et al.

OTHER PUBLICATIONS

Nam Joong Jeon et al., "Compositional engineering of perovskite materials for high-performance solar cells", Nature, vol. 517, Jan. 7, 2015.

Hong-Hua Fang et al., "Photoexcitation dynamics in solution-processed formamidinium lead iodide perovskite thin films for solar cell applications", Light: Science & Applications (2016) 5, Dec. 25, 2015, e16056.

Extended European Search Report issued in European Patent Application No. 20813105.2, Jul. 4, 2022.

Zhao Dewei et al., "Low-bandgap mixed tin-lead iodide perovskite absorbers with long carrier lifetimes for all-perovskite tandem solar cells" Nature Energy, vol. 2, No. 4, Mar. 1, 2017 (Mar. 1, 2017), XP055933972, DOI: 10.1038/nenergy.2017.18 Retrieved from the Internet: URL:http://www.nature.com/articles/nenergy201718>.

Zhao Dewei et al., "Low-bandgap mixed tin-lead iodide perovskite absorbers with long carrier lifetimes for all-perovskite tandem solar cells", Nature Energy, vol. 2, Mar. 1, 2017 (Mar. 1, 2017), 17018-1, XP055934182.

Steffen Braunger et al., CsxFA1-xPb(I1-yBry)3 Perovskite Compositions: the Appearance of Wrinkled Morphology and its Impact on Solar Cell Performance, The Journal of Physical Chemistry C, Jul. 11, 2018 (Jul. 11, 2018), vol. 122, No. 30, pp. 17123-17135, DOI: 10.1021/acs.jpcc.8b06459.

* cited by examiner

PHOTOELECTRIC CONVERSION FILM, SOLAR CELL USING SAME, AND METHOD FOR PRODUCING PHOTOELECTRIC CONVERSION FILM

BACKGROUND

1. Technical Field

The present disclosure relates to a photoelectric conversion film, a solar cell using the photoelectric conversion film, and a method for producing photoelectric conversion films.

2. Description of the Related Art

In recent years, perovskite solar cells have been researched and developed. In perovskite solar cells, a photoelectric conversion material is used that is a perovskite compound formed of a perovskite crystal structure represented by the chemical formula $AMX_3$ (where A is a monovalent cation, M is a divalent cation, and X is a halogen anion) or a structure analogous thereto.

Perovskite solar cells have a stack structure that includes two electrodes opposed to each other and a photoelectric conversion layer disposed between the electrodes which absorbs light and generates separate charges. The photoelectric conversion layer is a layer including a perovskite compound (hereinafter, written as the "perovskite layer"). For example, the perovskite compound represented by $HC(NH_2)_2PbI_3$ (hereinafter, sometimes abbreviated as "$FAPbI_3$") may be used.

In particular, high photoelectric conversion efficiency is exhibited by solar cells that have a perovskite layer including a lead-based perovskite compound represented by the chemical formula $AMX_3$ in which M is lead (hereinafter, such solar cells may be referred to as "lead-based perovskite solar cells"). For example, lead-based perovskite solar cells achieving efficiency as high as more than 20% have been reported. Among perovskite layers including a lead-based perovskite compound, a perovskite layer including $FAPbI_3$ has the lowest bandgap of 1.4 eV. This value of bandgap is equal to the energy gap at which sunlight is absorbed most efficiently. Thus, perovskite layers including $FAPbI_3$ hold promise for the fabrication of more efficient solar cells among other perovskite layers including a lead-based perovskite compound.

Jeon, Nature 517, (2015) p. 476, and Fang, Light: Science & Applications 5, (2016) e16056 disclose methods for producing $FAPbI_3$ thin films. These literatures suggest that perovskite solar cells having high conversion efficiency may be fabricated by using $FAPbI_3$ in perovskite layers in the solar cells.

SUMMARY

One non-limiting and exemplary embodiment provides a photoelectric conversion film having a high light absorption ability and a long carrier life.

In one general aspect, the techniques disclosed here feature a photoelectric conversion film that includes a perovskite compound including a monovalent formamidinium cation, a Pb cation and an iodide ion, the photoelectric conversion film having a film thickness of greater than or equal to 1 μm, the ratio of root mean square roughness Rq to the film thickness being less than or equal to 0.13.

The photoelectric conversion film provided according to the present disclosure has a high light absorption ability and a long carrier life.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1A:
FIG. 1A is a schematic sectional view of a photoelectric conversion film for illustrating the outline of a method for producing a photoelectric conversion film according to the first embodiment of the present disclosure.

<Underlying Knowledge Forming Basis of the Present Disclosure>

Knowledge forming the basis of the present disclosure will be described below.

In FAPbI$_3$, the transition is direct and the absorption coefficient is high until absorption of light of 1.5 eV (that is, 800 nm wavelength). Thus, a film including FAPbI$_3$ absorbs light having a wavelength of less than or equal to 800 nm even when the thickness of the film including FAPbI$_3$ is greater than or equal to 200 nm. However, the transition upon absorption of light in the range of 1.5 eV to 1.4 eV (that is, 800 nm to 900 nm wavelengths) is indirect. Thus, a film including FAPbI$_3$ needs to have a thickness of greater than or equal to 1 µm in order to absorb light in the above energy band. The amount of light that can be absorbed by a 1 µm or thicker film is expected to increase by 10% or more in terms of solar spectrum area ratio as compared to when a thin film having a film thickness of about several hundreds of nm absorbs light of up to only 1.5 eV.

According to studies conducted by the present inventors, the conventional perovskite layers described in the section of the related art have a drawback in that when the film thickness is increased, electrons and holes (carriers) generated by photoexcitation have a shorter life and more carriers recombine and disappear. Thus, the conversion efficiency of solar cells cannot be enhanced.

The present inventors have further investigated the reason why the carrier life is shortened when the film thickness is increased, and have consequently found out the following. When, for example, an FAPbI$_3$ film is a thick film with a film thickness of greater than or equal to 1 µm, the film quality is low and the surface roughness is high to give rise to a decrease in carrier life. Because the carrier life is short, the film thickness has to be reduced to about several hundreds of nm in order to ensure that the generated carriers will be taken out. Due to this fact, light absorption is disadvantageously limited to about 1.5 eV of solar energy. Further, an FAPbI$_3$ film with high surface roughness makes it difficult to form a carrier-collecting electrode layer on the FAPbI$_3$ film used as a photoelectric conversion layer in a solar cell. Thus, increasing the film thickness of an FAPbI$_3$ film has another challenge that the fabrication of a solar cell using the FAPbI$_3$ film is difficult.

The present inventors then studied photoelectric conversion films capable of increasing the conversion efficiency of solar cells and also studied methods for producing such photoelectric conversion films. The findings from the studies will be described in more detail below.

A perovskite layer is usually formed by an application method such as a spin coating method. In such an application method, for example, a solution that includes elements for constituting a perovskite compound and a solvent (hereinafter, "perovskite solution") is applied onto a substrate, and the wet film is heated and dried to give a perovskite layer. However, this application method is capable of forming a flat film only to a thickness of about 500 nm, and films formed with a larger thickness have an increased amount of surface roughness and are hardly flat. When an attempt is made in which a plurality of 500 nm flat perovskite layers are laminated on top of one another to form a flat thick film, a perovskite solution applied on top of a lower layer dissolves the perovskite compound in the lower layer. Thus, stacking perovskite layers into a large thickness is difficult.

The present inventors have found another approach in which a seed layer that promotes the growth of a perovskite layer is formed on a substrate and is then brought into contact with the surface of a perovskite solution, and the seed layer is immediately dissolved and is replaced by a perovskite layer that is precipitated afterward. The present inventors have also found that the perovskite layer thus precipitated has small surface roughness even when formed with a film thickness of greater than or equal to 1 µm and improves the shortening of carrier life.

A perovskite layer obtained by the above method can construct a photoelectric conversion film that has a larger film thickness than conventional and is capable of absorbing light in an energy band of 1.4 eV to 1.5 eV. When such a photoelectric conversion film is used in a solar cell, the solar cell generates a larger amount of carriers by the increase in spectrum band of light that can be absorbed, and thus can achieve higher conversion efficiency.

As described above, the present inventors have developed a photoelectric conversion film of the present disclosure that can concurrently satisfy a film thickness of greater than or equal to 1 µm and a long carrier life.

EMBODIMENTS OF THE PRESENT DISCLOSURE

Hereinbelow, embodiments of the present disclosure will be described in detail with reference to the drawings.

First Embodiment

A photoelectric conversion film according to the first embodiment of the present disclosure includes a perovskite compound including a monovalent formamidinium cation (namely, NH$_2$CHNH$_2^+$), a Pb cation and an iodide ion. Hereinbelow, this perovskite compound may be written as the "perovskite compound in the present embodiment". The photoelectric conversion film is a light-absorbing film. The photoelectric conversion film according to the present embodiment has a film thickness of greater than or equal to 1 µm. In the photoelectric conversion film according to the present embodiment, the ratio of the root mean square roughness Rq to the film thickness is less than or equal to 0.13.

The photoelectric conversion film according to the present embodiment includes a perovskite compound composed of a monovalent formamidinium cation, a Pb cation and an iodide ion, and has a film thickness of greater than or equal to 1 µm. As a result of this configuration, the photoelectric conversion film can also absorb light in the band of 1.4 eV to 1.5 eV and thus absorbs a larger amount of light than heretofore possible, thus attaining a high light absorption ability. Further, the photoelectric conversion film of the present embodiment has small surface roughness that satisfies a ratio of the root mean square roughness Rq to the film thickness of less than or equal to 0.13. As a result of this configuration, the shortening of carrier life is improved and a long carrier life may be realized. As described above, the photoelectric conversion film of the present embodiment may concurrently satisfy a high light absorption ability and a long carrier life.

In general, perovskite compounds are represented by, for example, the chemical formula AMX$_3$. In the chemical formula, A denotes a monovalent cation, M a divalent cation, and X a halogen anion. In line with the commonly used expressions in perovskite compounds, A, M and X in the present specification are also written as A-site, M-site and X-site, respectively. The perovskite compound in the present embodiment is composed of a monovalent formamidinium cation, a Pb cation and an iodide ion. Thus, the perovskite compound in the present embodiment is a perovskite compound represented by, for example, the chemical formula $HC(NH_2)_2PbI_3$ (that is, $FAPbI_3$). Here, $FAPbI_3$ has FA:Pb:I=1:1:3, but the composition may be slightly different as long as the A-site, the M-site and the X-site principally include FA, Pb and I, respectively.

The photoelectric conversion film according to the present embodiment may include the perovskite compound in the present embodiment in a major proportion. Here, the phrase "the photoelectric conversion film includes the perovskite compound in the present embodiment in a major proportion" means that the perovskite compound in the present embodiment represents greater than or equal to 70 mol % of all the substances constituting the photoelectric conversion film. For example, this proportion may be greater than or equal to 80 mol %.

The photoelectric conversion film according to the present embodiment may include a material other than the perovskite compounds in the present embodiment. For example, the photoelectric conversion film according to the present embodiment may include a trace amount of a perovskite compound which is different from $FAPbI_3$ and is represented by the chemical formula $A2M2X2_3$. A2 is a monovalent cation. For purposes such as to enhance durability, A2 may include a trace amount of such a monovalent cation as an alkali metal cation or an organic cation. More specifically, A2 may include a trace amount of methylammonium cation ($CH_3NH_3^+$) and/or cesium cation ($Cs^+$). M2 is a divalent cation. For purposes such as to enhance durability, M2 may include a trace amount of a transition metal and/or a divalent, Group 13 to Group 15 element cation. Specific examples include $Pb^{2+}$, $Ge^{2+}$ and $Sn^{2+}$. X2 is a monovalent anion such as a halogen anion. The cation A2-site, the cation M2-site and the anion X2-site may be each occupied by trace amounts of a plurality of kinds of ions. Specific examples of the perovskite compounds different from $FAPbI_3$ include $CH_3NH_3PbI_3$, $CH_3CH_2NH_3PbI_3$, $CH_3NH_3PbBr_3$, $CH_3NH_3PbCl_3$, $CsPbI_3$ and $CsPbBr_3$.

As described hereinabove, the photoelectric conversion film according to the present embodiment has a film thickness of greater than or equal to 1 μm. Depending on, for example, use application, the film thickness of the photoelectric conversion film according to the present embodiment may be appropriately selected from the range of greater than or equal to 1 μm and less than or equal to 100 μm.

The film thickness of the photoelectric conversion film according to the present embodiment may be less than or equal to 5.2 μm. When the film thickness of the photoelectric conversion film is less than or equal to 5.2 μm, the surface roughness of the photoelectric conversion film may be further reduced and consequently the carrier life may be extended.

As described above, the photoelectric conversion film according to the present embodiment has a ratio of the root mean square roughness Rq to the film thickness of less than or equal to 0.13. Here, the root mean square roughness Rq is measured in accordance with JIS B 0601: 2013. Details will be described below. Using a surface shape measuring device, three 500 μm wide profiles are measured and are each assessed to determine the root mean square roughness. The root mean square roughnesses measured with respect to the three points are averaged to give the root mean square roughness Rq. The film thickness of the photoelectric conversion film is determined using a surface shape measuring device. For example, three 500 μm wide profiles are measured using a surface shape measuring device. With respect to each of the profiles, three values in total of height from the substrate are averaged. The average values of height from the substrate, each measured with respect to the three points, are further averaged to determine the film thickness of the photoelectric conversion film.

In the photoelectric conversion film according to the present embodiment, the ratio of the root mean square roughness Rq to the film thickness may be less than or equal to 0.1. The photoelectric conversion film of the present embodiment may have smaller surface roughness that satisfies a ratio of the root mean square roughness Rq to the film thickness of less than or equal to 0.1. As a result of this configuration, the shortening of carrier life is improved more efficiently and a longer carrier life may be realized.

In the photoelectric conversion film according to the present embodiment, the ratio of the root mean square roughness Rq to the film thickness may be greater than or equal to 0.07. This configuration ensures that the photoelectric conversion film having a thickness of greater than or equal to 1 μm will have a minimum size of crystal grains that is necessary for realizing a long carrier life. Thus, the film may attain a longer carrier life and greater flatness.

Figure 1B:
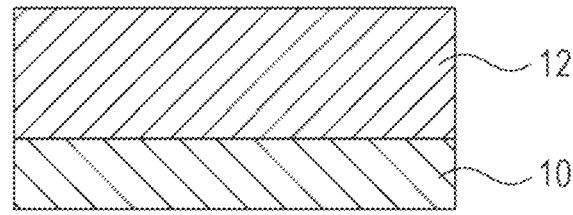
FIG. 1B is a schematic sectional view of a photoelectric conversion film for illustrating the outline of a method for producing a photoelectric conversion film according to the first embodiment of the present disclosure.

Next, an embodiment of a method for producing a photoelectric conversion film according to the present embodiment will be described. FIGS. 1A and 1B are schematic sectional views of a photoelectric conversion film for illustrating the outline of the method for producing a photoelectric conversion film according to the present embodiment.

The method for producing a photoelectric conversion film according to the present embodiment includes the following steps:

(A) a first solution including elements for constituting a first perovskite compound is brought into contact with a substrate 10, and the substrate 10 is heated to form a seed layer 11 including the first perovskite compound (see FIG. 1A); and (B) the substrate 10 and a second solution are heated, and the surface of the second solution is brought into contact with the surface of the seed layer 11 on the substrate 10 to precipitate a second perovskite compound, thereby producing a photoelectric conversion film 12 (see FIG. 1B).

Here, the second perovskite compound includes a monovalent formamidinium cation, a Pb cation and an iodide ion, and the second solution includes elements for constituting the second perovskite compound.

The above production method according to the present embodiment starts with the step (A) in which a seed layer 11 composed of a first perovskite compound is formed on a substrate 10. Next, in the step (B), a second solution is brought into contact with the surface of the seed layer 11 disposed on the substrate 10 to precipitate a second perovskite compound, thereby forming a photoelectric conversion film 12. In the step (B), the substrate 10 is allowed to stand while the second solution is in contact with the surface of the seed layer 11 disposed on the substrate 10 and while performing heating of the substrate 10. In this manner, the seed layer 11 dissipates into the second solution and concurrently the second perovskite compound is precipitated, and thereby the photoelectric conversion film 12 is obtained. That is, the second perovskite compound corresponds to the perovskite compound in the present embodiment. The photoelectric conversion film 12 produced by the above method attains small surface roughness even when formed with a film thickness of greater than or equal to 1 μm. Thus, it is possible to produce a photoelectric conversion film 12 having a film thickness of greater than or equal to 1 μm and satisfying a ratio of the root mean square roughness Rq to the film thickness of less than or equal to 0.13.

The step (A) and the step (B) will be described in more detail below.

The seed layer 11 formed in the step (A) is composed of a first perovskite compound. For example, the first perovskite compound forming the seed layer 11 may be a perovskite compound represented by the chemical formula A1M1X1$_3$. In the chemical formula A1M1X1$_3$, A1 is at least one selected from the group consisting of monovalent formamidinium cation, monovalent methylammonium cation, monovalent cesium cation and monovalent rubidium cation. M1 is at least one selected from the group consisting of Pb cation and Sn cation. X1 is a halogen anion.

When the seed layer 11 is composed of a perovskite compound represented by the chemical formula A1M1X1$_3$, a second perovskite compound is easily precipitated in the step (B) and will form a photoelectric conversion film having good film quality.

The first solution used to form the seed layer 11 includes elements for constituting the first perovskite compound. When the first perovskite compound is a perovskite compound represented by the chemical formula A1M1X1$_3$, the first solution includes, for example, compounds M1X12 and A1X1 as raw materials for A1M1X1$_3$, and a solvent. The solvent may be any solvent that can dissolve the raw materials M1X12 and A1X1. For example, an organic solvent may be used. Examples of the organic solvents include alcohol solvents, amide solvents, nitrile solvents, hydrocarbon solvents and lactone solvents. A mixture of two or more kinds of these solvents may be used. The solvent may contain an additive. Such an additive may induce crystal nucleation and promote crystal growth. Examples of the additives include hydrogen iodide, amines and surfactants.

The first perovskite compound may be a compound that is the same as or different from the second perovskite compound contained in the photoelectric conversion film that will be produced.

For example, the first solution may be brought into contact with the substrate 10 by an application method such as a spin coating method or a dip coating method, or a printing method. When the photoelectric conversion film 12 fabricated by the production method according to the present embodiment is a photoelectric conversion layer in a solar cell, for example, the substrate 10 may be a substrate having an electrode layer on its surface or may be a substrate having on its surface a stack of an electrode layer and a carrier transport layer (for example, a hole transport layer or an electron transport layer) in this order.

Next, the substrate 10 contacted with the first solution is heated to, for example, a first temperature to dry the first solution sitting on the surface. The first temperature may be any temperature at which the solvent of the first solution can be dried. For example, an example of the first temperature is greater than or equal to 100° C. and less than or equal to 180° C. In this manner, as illustrated in FIG. 1A, a seed layer 11 composed of a first perovskite compound is formed.

For example, the thickness of the seed layer 11 is greater than or equal to 10 nm and less than or equal to 100 nm. When formed with a thickness of greater than or equal to 10 nm, the seed layer may attain enhanced functions. When, on the other hand, the seed layer is formed with a thickness of less than or equal to 100 nm, residues of the seed layer may be easily eliminated. That is, a photoelectric conversion film 12 free from a residual seed layer may be easily fabricated.

Next, the step (B) is performed. That is, a photoelectric conversion film 12 is formed on the substrate 10.

A second solution for forming a photoelectric conversion film 12 is provided. The second solution includes elements for constituting a second perovskite compound. The second perovskite compound corresponds to the perovskite compound in the present embodiment described hereinabove that is contained in the photoelectric conversion film according to the present embodiment. That is, the second perovskite compound is composed of a monovalent formamidinium cation, a Pb cation and an iodide ion. The second perovskite compound is, for example, a perovskite compound represented by the chemical formula FAPbI$_3$. In this case, the second solution includes elements for constituting FAPbI$_3$. For example, the second solution includes compounds PbI$_2$ and FAI as raw materials for FAPbI$_3$, and a solvent. The solvent that is used may be the same as the solvent in the first solution. A lactone (for example, γ-butyrolactone) may be used as the solvent in the second solution.

Next, the second solution is brought into contact with the surface of the seed layer 11 on the substrate 10. During this process, the substrate 10 is heated to a second temperature. The second temperature, to which the substrate 10 is heated at the time of contact between the seed layer 11 and the second solution, may be set to, for example, a temperature at which the second solution is saturated or supersaturated. In this manner, the seed layer 11 is immediately replaced by the second perovskite compound in the second solution. Then, the second perovskite compound grows on the substrate 10 to form a photoelectric conversion film 12. When, for example, the second solution includes a lactone solvent, supersaturation is reached in the range of greater than or equal to room temperature and less than or equal to 150° C. Thus, the second temperature may be set to, for example, greater than or equal to 90° C. and less than or equal to 130° C. In the step (B), at least the substrate 10 should be heated to the second temperature, and the second solution may or may not be heated. When the second solution is heated, the heating temperature may be lower than the second temperature.

The film thickness of the photoelectric conversion film may be controlled by controlling the amount of time of contact between the seed layer 11 and the second solution (that is, the amount of time for which the second perovskite compound is precipitated).

As described above, the photoelectric conversion film 12 may be formed by precipitating the second perovskite compound, for example, FAPbI$_3$, on the substrate 10. The thickness of the photoelectric conversion film 12 is greater than or equal to 1 μm. The flatness of the photoelectric conversion film 12 that is formed may be expressed by the root mean square roughness Rq in the thickness distribution. The root mean square roughness Rq is approximately less than or equal to 200 nm for photoelectric conversion layers in conventional highly efficient perovskite solar cells. The photoelectric conversion film 12 formed by the production method of the present embodiment may also attain a root mean square roughness Rq comparable to that of photoelectric conversion layers in conventional highly efficient perovskite solar cells.

Conventionally, a flat photoelectric conversion film that includes a perovskite compound represented by AMX$_3$ is formed by an application method. However, the conventional processes encounter difficulties in forming such a film with a film thickness of greater than or equal to 1 μm while reducing the root mean square roughness Rq to less than or equal to about 200 nm. Thus, it has been difficult to fabricate by the conventional process a photoelectric conversion film with a film thickness of greater than or equal to 1 μm while improving the shortening of carrier life. Further, as described hereinabove, difficulties are encountered in laminating flat photoelectric conversion films. Thus, it has been conventionally difficult to increase the thickness of a photoelectric conversion film while reducing the root mean square roughness Rq.

In contrast, the production method according to the present embodiment can form a photoelectric conversion film having a film thickness of greater than or equal to 1 μm while reducing the root mean square roughness Rq. Further, the production method according to the present embodiment can easily form a photoelectric conversion film with a desired thickness by controlling the formation conditions such as, for example, the amount of time for which the second perovskite compound is precipitated.

The thickness of the photoelectric conversion film that is formed may be selected appropriately in accordance with the use application of the photoelectric conversion film. The thickness of the photoelectric conversion film that is formed may be, for example, greater than or equal to 1 μm and less than or equal to 100 μm.

An example of the methods for producing a photoelectric conversion film according to the present embodiment will be further described in detail with reference to FIGS. 2A to 2D. FIGS. 2A to 2D are schematic views illustrating an example of the methods for producing a photoelectric conversion film according to the present embodiment.

Figure 2A:
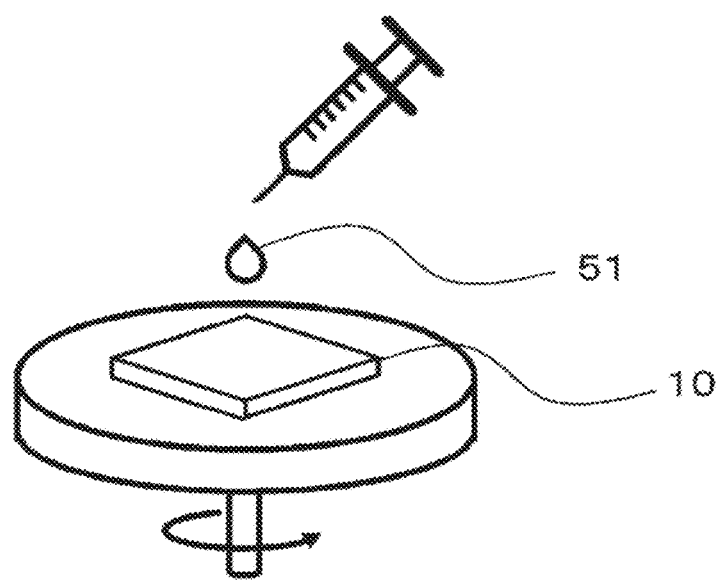
FIG. 2A is a schematic view illustrating an example method for producing a photoelectric conversion film according to the first embodiment of the present disclosure.
Figure 2B:
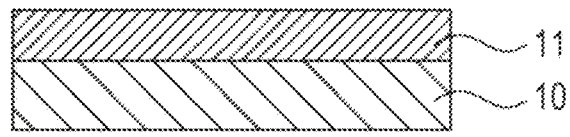
FIG. 2B is a schematic view illustrating an example method for producing a photoelectric conversion film according to the first embodiment of the present disclosure.

As illustrated in FIG. 2A, a first solution 51 is applied onto a substrate 10 by, for example, a spin coating method. Next, the substrate 10 coated with the first solution 51 is heated to dry the coating film of the first solution 51 on the substrate 10. In this manner, as illustrated in FIG. 2B, a seed layer 11 composed of a first perovskite compound is formed.

Figure 2C:
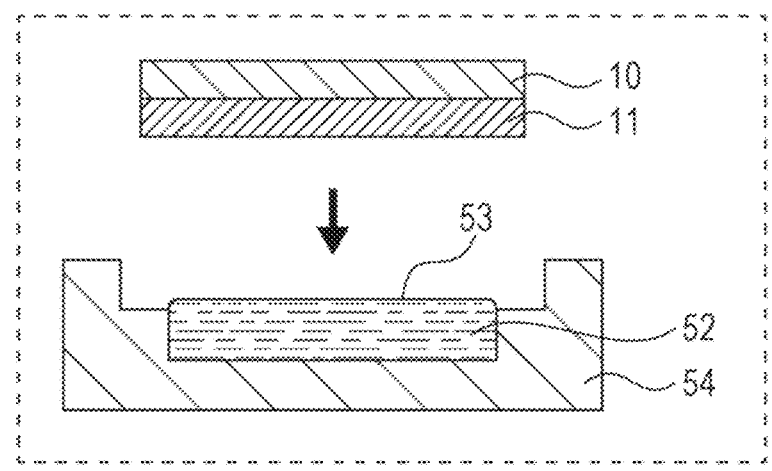
FIG. 2C is a schematic view illustrating an example method for producing a photoelectric conversion film according to the first embodiment of the present disclosure.
Figure 2D:
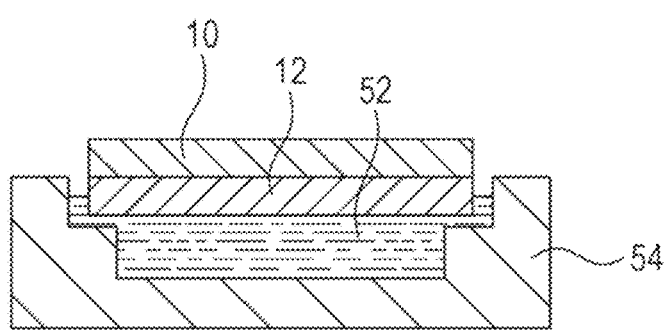
FIG. 2D is a schematic view illustrating an example method for producing a photoelectric conversion film according to the first embodiment of the present disclosure.

Next, as illustrated in FIG. 2C, a second solution 52 is held in a container 54, and the substrate 10 on which the seed layer 11 is disposed is approximated thereto to bring the surface of the seed layer 11 into contact with the surface 53 of the second solution 52. For example, a second solution 52 including $PbI_2$ and FAI is heated to a second temperature (for example, 100° C.), and the surface of the seed layer 11 on the substrate 10 that has been similarly heated to the second temperature is brought into contact with the surface 53 of the second solution 52. In this manner, the seed layer 11 is immediately replaced by $FAPbI_3$ in the second solution 52, and $FAPbI_3$ grows on the substrate 10. As a result, a photoelectric conversion film 12 is formed on the substrate 10 as illustrated in FIG. 2D. Incidentally, the heating temperature for the second solution 52 may be lower than the second temperature, or the second solution 52 may not be heated.

Second Embodiment

A solar cell according to the second embodiment of the present disclosure includes a first electrode, a second electrode and a photoelectric conversion layer. The photoelectric conversion layer is disposed between the first electrode and the second electrode. At least one electrode selected from the group consisting of the first electrode and the second electrode has translucency. The photoelectric conversion layer is the photoelectric conversion film described in the first embodiment. That is, the photoelectric conversion layer in the solar cell according to the second embodiment is a photoelectric conversion film which includes a perovskite compound including a monovalent formamidinium cation, a Pb cation and an iodide ion, and which has a film thickness of greater than or equal to 1 μm and a ratio of the root mean square roughness Rq to the film thickness of less than or equal to 0.13.

The photoelectric conversion layer in the solar cell according to the present embodiment has a thickness of greater than or equal to 1 μm. As a result of this configuration, the solar cell attains an enhanced light absorption ability and can absorb light in an increased spectrum band. Thus, the solar cell generates an increased amount of carriers and may realize high conversion efficiency. Further, the photoelectric conversion layer in the solar cell according to the present embodiment is composed of a quality photoelectric conversion film that has such a small surface roughness that the ratio of the root mean square roughness Rq to the film thickness is less than or equal to 0.13. As a result of this configuration, the solar cell according to the present embodiment may also realize a long carrier life. For these reasons, the solar cell according to the present embodiment may attain high conversion efficiency.

(First Example of Solar Cells)

Figure 3:
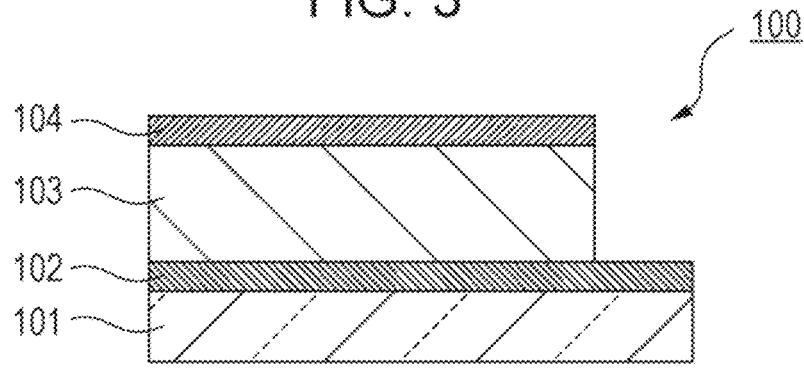
FIG. 3 is a sectional view schematically illustrating a first example of solar cells according to the second embodiment of the present disclosure.

FIG. 3 is a sectional view schematically illustrating a first example of the solar cells according to the second embodiment of the present disclosure.

In a solar cell 100 illustrated in FIG. 3, a first electrode 102, a photoelectric conversion layer 103 and a second electrode 104 are stacked in this order on a substrate 101. The solar cell 100 may not have the substrate 101.

Next, the basic working effects of the solar cell 100 will be described. When the solar cell 100 is irradiated with light, the photoelectric conversion layer 103 absorbs the light and generates excited electrons and holes. The excited electrons move to the first electrode 102 that is a negative electrode. On the other hand, the holes generated in the photoelectric conversion layer 103 move to the second electrode 104 that is a positive electrode. In this manner, the solar cell 100 can produce an electric current from the negative electrode and the positive electrode. While this example illustrates the first electrode 102 as functioning as the negative electrode and the second electrode 104 as functioning as the positive electrode, the first electrode 102 may function as the positive electrode and the second electrode 104 may function as the negative electrode.

For example, the solar cell 100 may be fabricated by the following method. First, a first electrode 102 is formed on the surface of a substrate 101 by a sputtering method or the like. Next, a photoelectric conversion layer 103 that is a photoelectric conversion film according to the first embodiment is formed by the method described in the first embodiment. Next, a second electrode 104 is formed on the photoelectric conversion layer 103 by a sputtering method or the like.

The components constituting the solar cell 100 will be described in detail hereinbelow.

(Substrate 101)

The substrate 101 supports other layers in the solar cell 100. The substrate 101 may be formed from a transparent material. For example, a glass substrate or a plastic substrate may be used. The plastic substrate may be, for example, a plastic film. When the first electrode 102 has sufficient strength, the substrate 101 is not necessarily provided because the first electrode 102 can support other layers.

(First Electrode 102 and Second Electrode 104)

The first electrode 102 and the second electrode 104 have conductivity. At least one of the first electrode 102 and the second electrode 104 is translucent. As used herein, the phrase "the electrode is translucent" means that the electrode transmits at least 10% of light having wavelengths of greater than or equal to 200 nm and less than or equal to 2000 nm, at any of these wavelengths.

For example, the translucent electrode may transmit light from the visible region to the near infrared region. The translucent electrode may be formed from at least one of transparent and conductive metal oxides and metal nitrides.

Examples of the metal oxides include:
(i) titanium oxides doped with at least one selected from the group consisting of lithium, magnesium, niobium and fluorine,
(ii) gallium oxides doped with at least one selected from the group consisting of tin and silicon,
(iii) indium-tin composite oxides,
(iv) tin oxides doped with at least one selected from the group consisting of antimony and fluorine, and
(v) zinc oxides doped with at least one selected from the group consisting of boron, aluminum, gallium and indium.

Two or more kinds of metal oxides may be used in combination as a composite.

Examples of the metal nitrides include gallium nitrides doped with at least one selected from the group consisting of silicon and oxygen. Two or more kinds of metal nitrides may be used in combination.

The metal oxides and the metal nitrides may be used in combination.

The translucent electrode may be formed using a non-transparent material so as to form a light-transmitting pattern. Examples of the light-transmitting patterns include linear patterns, wavy patterns, grid patterns, and punching metal-like patterns in which a large number of micro through-holes are regularly or irregularly arranged. When the electrode has such a pattern, light can be transmitted through regions where there is no electrode material. Examples of the non-transparent materials include platinum, gold, silver, copper, aluminum, rhodium, indium, titanium, iron, nickel, tin, zinc, and alloys containing any of these metals. Further, conductive carbon materials may also be used.

In the solar cell 100, the first electrode 102 is in contact with the photoelectric conversion layer 103. Thus, the first electrode 102 is formed of a material that has hole-blocking properties to block holes moving from the photoelectric conversion layer 103. In this case, the first electrode 102 does not make ohmic contact with the photoelectric conversion layer 103. The hole-blocking properties by which holes moving from the photoelectric conversion layer 103 are blocked mean that the electrode allows for the passage of only electrons generated in the photoelectric conversion layer 103 and blocks the passage of holes. The Fermi energy level of the material having the hole-blocking properties may be higher than the energy level at the upper end of the valence band with the photoelectric conversion layer 103. Examples of such materials include aluminum.

In the solar cell 100, the second electrode 104 is in contact with the photoelectric conversion layer 103. Thus, the second electrode 104 is formed of a material that has electron-blocking properties to block electrons moving from the photoelectric conversion layer 103. In this case, the second electrode 104 does not make ohmic contact with the photoelectric conversion layer 103. The electron-blocking properties by which electrons moving from the photoelectric conversion layer 103 are blocked mean that the electrode allows for the passage of only holes generated in the photoelectric conversion layer 103 and blocks the passage of electrons. The Fermi energy level of the material having the electron-blocking properties is lower than the energy level at the lower end of the conduction band of the photoelectric conversion layer 103. The Fermi energy level of the material having the electron-blocking properties may be lower than the Fermi energy level of the photoelectric conversion layer 103. Specifically, the second electrode 104 may be formed from platinum, gold or a carbon material such as graphene. These materials have electron-blocking properties but do not have translucency. Thus, when a translucent second electrode 104 is to be fabricated using such a material, a light-transmitting pattern such as one described hereinabove is formed in the second electrode 104.

The light transmittance of the translucent electrode may be greater than or equal to 50%, or greater than or equal to 80%. The wavelength of light transmitted through the electrode depends on the wavelength absorbed by the photoelectric conversion layer 103. The thicknesses of the first electrode 102 and the second electrode 104 are, for example, each greater than or equal to 1 nm and less than or equal to 1000 nm.

(Photoelectric Conversion Layer 103)

The photoelectric conversion layer 103 is the photoelectric conversion film according to the first embodiment. Thus, detailed description is omitted.

(Second Example of Solar Cells)

A modified example of the solar cells according to the second embodiment of the present disclosure will be described.

Figure 4:
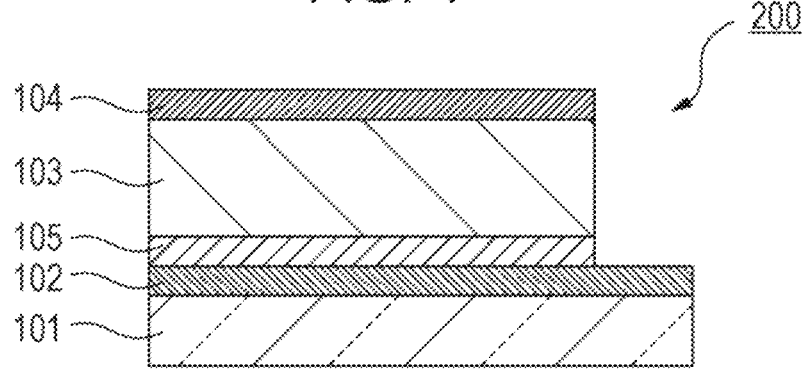
FIG. 4 is a sectional view schematically illustrating a second example of solar cells according to the second embodiment of the present disclosure.

FIG. 4 is a sectional view schematically illustrating a second example of the solar cells according to the second embodiment of the present disclosure. A solar cell 200 illustrated in FIG. 4 differs from the solar cell 100 shown in FIG. 3 in that an electron transport layer 105 is present. The components having the same functions and configurations as in the solar cell 100 are designated by numerals common to those in the solar cell 100, and the description thereof will be omitted.

In the solar cell 200 illustrated in FIG. 4, a first electrode 102, an electron transport layer 105, a photoelectric conversion layer 103 and a second electrode 104 are stacked in this order on a substrate 101.

Next, the basic working effects of the solar cell 200 will be described. When the solar cell 200 is irradiated with light, the photoelectric conversion layer 103 absorbs the light and generates excited electrons and holes. The excited electrons move through the electron transport layer 105 to the first electrode 102 that is a negative electrode. On the other hand, the holes generated in the photoelectric conversion layer 103 move to the second electrode 104 that is a positive electrode. In this manner, the solar cell 200 can produce an electric current from the negative electrode and the positive electrode.

The solar cell 200 may be fabricated by the same method as the solar cell 100 illustrated in FIG. 3. The electron transport layer 105 is formed on the first electrode 102 by a sputtering method or the like.

The components constituting the solar cell 200 will be described in detail hereinbelow.

(First Electrode 102)

The first electrode 102 in the solar cell 200 is the same as the first electrode 102 in the solar cell 100. However, because the solar cell 200 includes the electron transport layer between the photoelectric conversion layer 103 and the first electrode 102, the first electrode 102 does not necessarily have hole-blocking properties by which holes moving from the photoelectric conversion layer 103 are blocked. That is, the first electrode 102 may be formed of a material capable of forming an ohmic contact with the photoelectric conversion layer 103. Because the first electrode 102 in the solar cell 200 does not necessarily have hole-blocking properties, the material for the first electrode 102 may be selected from a wider range of materials.

(Electron Transport Layer 105)

The electron transport layer 105 includes a semiconductor. The electron transport layer 105 may be a semiconductor having a bandgap of greater than or equal to 3.0 eV. By forming the electron transport layer 105 from a semiconductor having a bandgap of greater than or equal to 3.0 eV, visible light and infrared light may be transmitted to the photoelectric conversion layer 103. Examples of such semiconductors include organic n-type semiconductors and inorganic n-type semiconductors.

Examples of the organic n-type semiconductors include imide compounds, quinone compounds, fullerenes and fullerene derivatives. Examples of the inorganic n-type semiconductors include metal oxides, metal nitrides and perovskite oxides. Examples of the metal oxides include oxides of Cd, Zn, In, Pb, Mo, W, Sb, Bi, Cu, Hg, Ti, Ag, Mn, Fe, V, Sn, Zr, Sr, Ga, Si or Cr. Specific examples include $TiO_2$. Examples of the perovskite oxides include SrTiO and $CaTiO_3$.

The electron transport layer 105 may include a substance having a bandgap greater than 6.0 eV. Examples of the substances having a bandgap greater than 6.0 eV include (i) halides of alkali metals or alkaline earth metals such as lithium fluoride and calcium fluoride, (ii) alkali metal oxides such as magnesium oxide, and (iii) silicon dioxide. In this case, the thickness of the electron transport layer 105 is, for example, less than or equal to 10 nm in order to ensure electron-transporting properties of the electron transport layer 105.

The electron transport layer 105 may include a plurality of layers made of different materials from one another.

(Third Example of Solar Cells)

A modified example of the solar cells according to the second embodiment of the present disclosure will be described.

Figure 5:
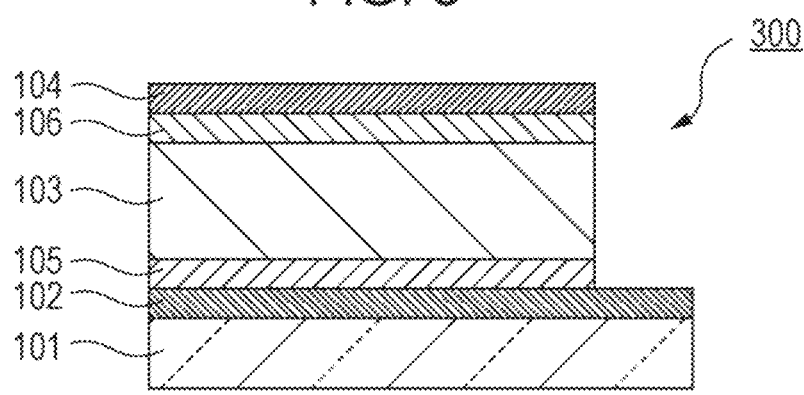
FIG. 5 is a sectional view schematically illustrating a third example of solar cells according to the second embodiment of the present disclosure.

FIG. 5 is a sectional view schematically illustrating a third example of the solar cells according to the second embodiment of the present disclosure. A solar cell 300 illustrated in FIG. 5 differs from the solar cell 200 shown in FIG. 4 in that a hole transport layer 106 is present. The components having the same functions and configurations as in the solar cell 100 and the solar cell 200 are designated by numerals common to those in the solar cell 100 and the solar cell 200, and the description thereof will be omitted.

In the solar cell 300 illustrated in FIG. 5, a first electrode 102, an electron transport layer 105, a photoelectric conversion layer 103, a hole transport layer 106 and a second electrode 104 are stacked in this order on a substrate 101.

Next, the basic working effects of the solar cell 300 will be described. When the solar cell 300 is irradiated with light, the photoelectric conversion layer 103 absorbs the light and generates excited electrons and holes. The excited electrons move through the electron transport layer 105 to the first electrode 102 that is a negative electrode. On the other hand, the excited holes move through the hole transport layer 106 to the second electrode 104 that is a positive electrode. In this manner, the solar cell 300 can produce an electric current from the negative electrode and the positive electrode.

The solar cell 300 may be fabricated by the same method as the solar cell 200 illustrated in FIG. 4. The hole transport layer 106 is formed on the photoelectric conversion layer 103 by an application method or the like.

The components constituting the solar cell 300 will be described in detail hereinbelow.

(Second Electrode 104)

The second electrode 104 in the solar cell 300 is the same as the second electrode 104 in the solar cell 200. However, because the solar cell 300 includes the hole transport layer between the photoelectric conversion layer 103 and the second electrode 104, the second electrode 104 does not necessarily have electron-blocking properties by which electrons moving from the photoelectric conversion layer 103 are blocked. That is, the second electrode 104 may be formed of a material capable of forming an ohmic contact with the photoelectric conversion layer 103. Because the second electrode 104 in the solar cell 300 does not necessarily have electron-blocking properties, the material for the second electrode 104 may be selected from a wider range of materials.

(Hole Transport Layer 106)

The hole transport layer 106 is composed of an organic substance or an inorganic semiconductor. The hole transport layer 106 may include a plurality of layers made of different materials from one another.

Examples of the organic substances include phenylamines, triphenylamine derivatives and polytriarylamines (poly (bis(4-phenyl)(2,4,6-trimethylphenyl)amine: PTAA) each including a tertiary amine in the skeleton, and PEDOT (poly(3,4-ethylenedioxythiophene) compounds including a thiophene structure. The molecular weight is not particularly limited, and the organic substances may be polymers. When the hole transport layer 106 is formed using such an organic substance, the film thickness may be greater than or equal to 1 nm and less than or equal to 1000 nm, or may be greater than or equal to 100 nm and less than or equal to 500 nm. The film thickness in this range ensures that sufficient hole-transporting properties will be exhibited. The film thickness in the above range also ensures that low resistance will be maintained and the energy of light may be highly efficiently converted to electricity.

Examples of the inorganic semiconductors that may be used include p-type semiconductors such as CuO, $Cu_2O$, CuSCN, molybdenum oxide and nickel oxide. When the hole transport layer 106 is formed using such an inorganic semiconductor, the film thickness may be greater than or equal to 1 nm and less than or equal to 1000 nm, or may be greater than or equal to 10 nm and less than or equal to 50 nm. The film thickness in this range ensures that sufficient hole-transporting properties will be exhibited. The film thickness in the above range also ensures that low resistance will be maintained and the energy of light may be highly efficiently converted to electricity.

The hole transport layer 106 may be formed by an application method or a printing method. Examples of the application methods include doctor blade methods, bar coating methods, spraying methods, dip coating methods and spin coating methods. Examples of the printing methods include screen printing methods. Where necessary, a plurality of materials may be mixed to form a hole transport layer 106, and the hole transport layer 106 may be then pressed or heat-treated. When the material for the hole transport layer 106 is an organic low-molecular substance or an inorganic semiconductor, the hole transport layer 106 may be formed by a vacuum deposition method or the like.

The hole transport layer 106 may include a supporting electrolyte and a solvent. A supporting electrolyte and a solvent stabilize the holes in the hole transport layer 106.

Examples of the supporting electrolytes include ammonium salts and alkali metal salts. Examples of the ammonium salts include tetrabutylammonium perchlorate, tetraethylammonium hexafluorophosphate, imidazolium salts and pyridinium salts. Examples of the alkali metal salts include lithium perchlorate and potassium tetrafluoroborate.

The solvent contained in the hole transport layer 106 may have high ion conductivity. Any aqueous solvents and organic solvents may be used. To stabilize the solutes to a higher degree, the solvent may be an organic solvent. Examples of the organic solvents include heterocyclic compounds such as tert-butylpyridine, pyridine and n-methylpyrrolidone.

The solvent contained in the hole transport layer 106 may be an ionic liquid. An ionic liquid may be used alone or as a mixture with other solvents. Ionic liquids are preferable because of low volatility and high flame retardancy.

Examples of the ionic liquids include imidazolium compounds such as 1-ethyl-3-methylimidazolium tetracyanoborate, pyridine compounds, alicyclic amine compounds, aliphatic amine compounds and azonium amine compounds.

In the present specification, the thickness of each of the layers other than the photoelectric conversion film may be an average of values measured at an appropriate number of points (for example, 5 points). The thickness of each layer may be measured with respect to an electron micrograph of a cross section.

EXAMPLES

The present disclosure will be described in greater detail with reference to the following EXAMPLES.

Photoelectric conversion films of EXAMPLES 1 to 3 and COMPARATIVE EXAMPLE 1 were fabricated, and the carrier life of these photoelectric conversion films was evaluated.

First, the configurations and the methods for fabrication of the photoelectric conversion films of EXAMPLES and COMPARATIVE EXAMPLE will be described.

Example 1

Photoelectric conversion films of EXAMPLES 1-1 to 1-7 were fabricated by the following method.

A 24.5 mm square glass substrate with a thickness of 0.7 mm was provided as a substrate.

Next, a seed layer was formed on the substrate. The seed layer was formed by an application method. A first solution for forming the seed layer was prepared which was a dimethylsulfoxide (DMSO) solution containing 1 mol/L lead iodide ($PbI_2$) (manufactured by Tokyo Chemical Industry Co., Ltd.) and 1 mol/L methylammonium iodide ($CH_3NH_3I$) (manufactured by Greatcell Solar Materials).

Next, the first solution was applied onto the substrate by a spin coating method. In this process, 200 μL of chlorobenzene as a poor solvent was dropped onto the substrate being rotated.

Thereafter, the substrate was heat-treated on a hot plate at 110° C. for 10 minutes to form a 300 nm thick seed layer on the substrate.

Subsequently, a photoelectric conversion film was formed. A second solution for forming the photoelectric conversion film was prepared which was a γ-butyrolactone (GBL) solution containing $PbI_2$ (manufactured by Tokyo Chemical Industry Co., Ltd.) and formamidinium iodide ($CH(NH_2)_2I$) (manufactured by Greatcell Solar Materials). In the fabrication of photoelectric conversion films in EXAMPLES 1-1 to 1-7, the $PbI_2$ concentrations and the $CH(NH_2)_2I$ concentrations in the second solutions, that is, the concentrations of $FAPbI_3$ in the second solutions are described in Table 1.

Next, the second solution and the substrate having the seed layer were each heated. In the fabrication of photoelectric conversion films in EXAMPLES 1-1 to 1-7, the heating temperatures for the second solution and the substrate are described in Table 1. Thereafter, the surface of the seed layer on the substrate that had been heated was brought into contact with the surface of the heated second solution for 1 second. Consequently, the seed layer was replaced by $FAPbI_3$ that was precipitated. Photoelectric conversion films composed of $FAPbI_3$ were thus obtained.

Example 2

Photoelectric conversion films of EXAMPLES 2-1 to 2-3 were fabricated by the following method.

In EXAMPLE 2, the DMSO solution including $PbI_2$ and $CH_3NH_3I$ that was used in EXAMPLE 1 as the first solution for forming the seed layer was replaced by a mixed solution of the following solutions A, B and C.

The solution A was a solution prepared so as to include 1.1 mol/L lead iodide ($PbI_2$) (manufactured by Tokyo Chemical Industry Co., Ltd.), 1 mol/L formamidinium iodide ($CH(NH_2)_2I$) (manufactured by Greatcell Solar Materials), 0.22 mol/L lead bromide ($PbBr_2$) (manufactured by Tokyo Chemical Industry Co., Ltd.) and 0.2 mol/L methylammonium bromide (MABr) (manufactured by Greatcell Solar Materials). The solvent in the solution A was a mixed solvent including dimethylformamide (DMF) and dimethyl sulfoxide (DMSO) in a volume ratio of 4:1.

The solution B was a DMSO solution prepared so as to include 1.5 mol/L cesium iodide (CsI) (manufactured by Sigma-Aldrich).

The solution C was a solution prepared so as to include 1.5 mol/L rubidium iodide (RbI) (manufactured by Sigma-Aldrich). The solvent in the solution C was a mixed solvent including DMF and DMSO in a volume ratio of 4:1.

The solution A, the solution B and the solution C were mixed together in a ratio (by volume) of solution A:solution B:solution C=90:5:5 to give the first solution.

Next, the first solution was applied onto the substrate by a spin coating method. During this process, 200 μL of chlorobenzene as a poor solvent was dropped onto the substrate being rotated.

Thereafter, the substrate was heat-treated on a hot plate at 115° C. for 10 minutes and was further heat-treated on a hot plate at 100° C. for 30 minutes to form a 400 nm thick seed layer on the substrate.

A photoelectric conversion film was fabricated in the same manner as in EXAMPLE 1. In the fabrication of photoelectric conversion films in EXAMPLES 2-1 to 2-3, the $PbI_2$ concentrations and the $CH(NH_2)_2I$ concentrations in the second solutions, that is, the concentrations of $FAPbI_3$ in the second solutions are described in Table 1. In the fabrication of photoelectric conversion films in EXAMPLES 2-1 to 2-3, the heating temperatures for the substrate and the second solution at the time of contact of the surface of the seed layer on the substrate with the second solution were 100° C.

Example 3

Photoelectric conversion films of EXAMPLES 3-1 to 3-4 were fabricated by the following method.

In EXAMPLE 3, the DMSO solution including $PbI_2$ and $CH_3NH_3I$ that was used in EXAMPLE 1 as the first solution for forming the seed layer was replaced by a DMSO solution prepared so as to include 1 mol/L lead iodide ($PbI_2$) and 1 mol/L formamidinium iodide ($CH(NH_2)_2I$).

Next, the first solution was applied onto the substrate by a spin coating method. During this process, 200 μL of chlorobenzene as a poor solvent was dropped onto the substrate being rotated.

Thereafter, the substrate was heat-treated on a hot plate at 115° C. for 1 minute and was further heat-treated on a hot plate at 180° C. for 10 minutes to form a 300 nm thick seed layer on the substrate.

The 300 nm thick seed layer was formed on the substrate in the same manner as in EXAMPLE 1 except that the first solution was different. A photoelectric conversion film was fabricated in the same manner as in EXAMPLE 1. In the fabrication of photoelectric conversion films in EXAMPLES 3-1 to 3-4, the $PbI_2$ concentrations and the $CH(NH_2)_2I$ concentrations in the second solutions, that is, the concentrations of $FAPbI_3$ in the second solutions were 1 mol/L. In the fabrication of photoelectric conversion films in EXAMPLES 3-1 to 3-4, the heating temperatures for the substrate and the second solution at the time of contact of the surface of the seed layer on the substrate with the second solution were 100° C. In the fabrication of photoelectric conversion films in EXAMPLES 3-1 to 3-4, the surface of the seed layer on the substrate was kept in contact with the second solution for different amounts of time. The amounts of contact time are described in Table 1.

Comparative Example 1

Photoelectric conversion films of COMPARATIVE EXAMPLES 1-1 to 14 were fabricated by the following method.

A24.5 mm square glass substrate with a thickness of 0.7 mm was provided as a substrate.

A dimethyl sulfoxide (DMSO) solution was prepared which included lead iodide ($PbI_2$) (manufactured by Tokyo Chemical Industry Co., Ltd.) and formamidinium iodide ($CH(NH_2)_2I$) (manufactured by Greatcell Solar Materials). In the fabrication of photoelectric conversion films in COMPARATIVE EXAMPLES 1-1 to 1-4, the $PbI_2$ concentrations and the $CH(NH_2)_2I$ concentrations in the DMSO solutions, that is, the concentrations of $FAPbI_3$ in the DMSO solutions are described in Table 1. The DMSO solution was applied onto the substrate and was heat-treated in the same manner as the seed layer was formed in EXAMPLE 1, thereby forming a photoelectric conversion film on the substrate.

<Measurement of Film Thickness H of Photoelectric Conversion Films>

The film thickness H of the photoelectric conversion films of EXAMPLES 1 to 3 and COMPARATIVE EXAMPLE 1 was measured as follows. Using DekTak (manufactured by Bruker Japan K.K.), 500 μm wide profiles were measured and assessed to determine three average heights from the substrate, and the three average heights were further averaged to calculate the film thickness H of the photoelectric conversion film. The results are described in Table 1. The three average heights that were measured are the average height at points in the center of the substrate, the average height at points 7 mm to the left from the center of the substrate, and the average height at points 7 mm to the right from the center of the substrate.

<Measurement of Root Mean Square Roughness Rq of Photoelectric Conversion Films>

The root mean square roughness Rq of the photoelectric conversion films of EXAMPLES 1 to 3 and COMPARATIVE EXAMPLE 1 was measured as follows. Using DekTak (manufactured by Bruker Japan K.K.), three 500 μm wide profiles were measured. The three profiles were assessed to determine the root mean square roughnesses, which were then averaged to determine the root mean square roughness Rq of the photoelectric conversion film. The results are described in Table 1.

<Relationship Between Film Thickness H and Root Mean Square Roughness Rq>

Using the film thickness H and the root mean square roughness Rq measured by the above methods, the ratio of the root mean square roughness Rq to the film thickness H (hereinafter, written as "Rq/H") was calculated. The results are described in Table 1. As shown in Table 1, the photoelectric conversion films of EXAMPLES 1 to 3 had a film thickness of greater than or equal to 1 μm but still attained a small root mean square roughness Rq that satisfied Rq/H of less than or equal to 0.13. In contrast, the photoelectric conversion films of COMPARATIVE EXAMPLE 1 had such a large root mean square roughness Rq that Rq/H was far above 0.13 when the film thickness was greater than or equal to 1 μm.

As discussed above, the photoelectric conversion films of EXAMPLES 1, 2 and 3 attained a small increase in surface roughness when formed with an increased film thickness as compared to the photoelectric conversion films of COMPARATIVE EXAMPLE 1.

<SEM Images of Cross Sections of Photoelectric Conversion Films>

Figure 6:
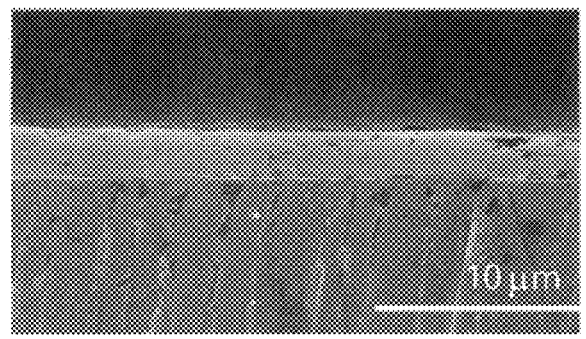
FIG. 6 illustrates a scanning electron microscope (SEM) image of a cross section of a photoelectric conversion film of EXAMPLE 1-4.
Figure 7:
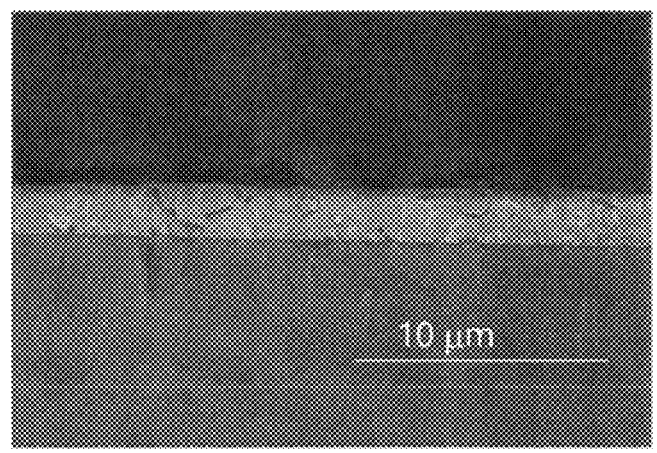
FIG. 7 illustrates a SEM image of a cross section of a photoelectric conversion film of EXAMPLE 2-2.
Figure 8:
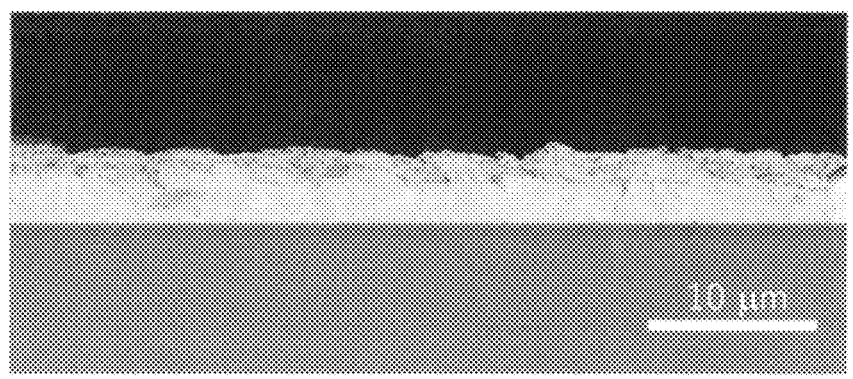
FIG. 8 illustrates a SEM image of a cross section of a photoelectric conversion film of EXAMPLE 3-1.
Figure 9A:
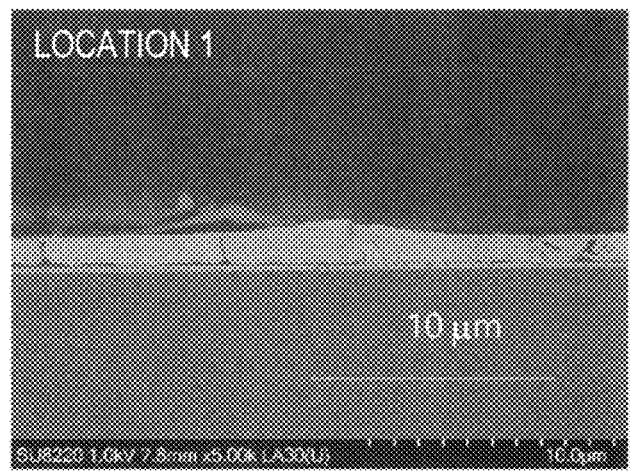
FIG. 9A illustrates a SEM image of a cross section at location 1 of a photoelectric conversion film of COMPARATIVE EXAMPLE 1-4.
Figure 9B:
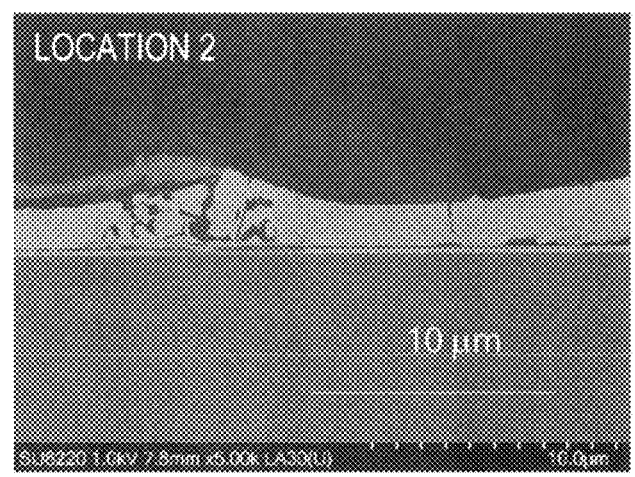
FIG. 9B illustrates a SEM image of a cross section at location 2 of the photoelectric conversion film of COMPARATIVE EXAMPLE 1-4.

FIG. 6 illustrates a SEM image of a cross section of the photoelectric conversion film of EXAMPLE 1-4. FIG. 7 illustrates a SEM image of a cross section of the photoelectric conversion film of EXAMPLE 2-2. FIG. 8 illustrates a SEM image of a cross section of the photoelectric conversion film of EXAMPLE 3-1. FIG. 9A illustrates a SEM image of a cross section at location 1 of the photoelectric conversion film of COMPARATIVE EXAMPLE 1-4. FIG. 9B illustrates a SEM image of a cross section at location 2 of the photoelectric conversion film of COMPARATIVE EXAMPLE 1-4.

As can be seen from FIGS. 6, 7 and 8, the photoelectric conversion films of EXAMPLES had small surface roughness and a substantially uniform film thickness. In contrast, as can be seen from FIGS. 9A and 9B, the observation showed that the photoelectric conversion film of COMPARATIVE EXAMPLE had varied film thicknesses distributed depending on locations, and the surface roughness was large. As clear from here and also from the results of the measurement of the root mean square roughness Rq described in Table 1, the photoelectric conversion films of EXAMPLES attained small surface roughness compared to the photoelectric conversion films of COMPARATIVE EXAMPLE. Further, from the SEM images of FIGS. 6, 7 and 8, the seed layer had disappeared in the photoelectric conversion films of EXAMPLES, and the photoelectric conversion films obtained were uniform.

<Carrier Life>

Figure 10:
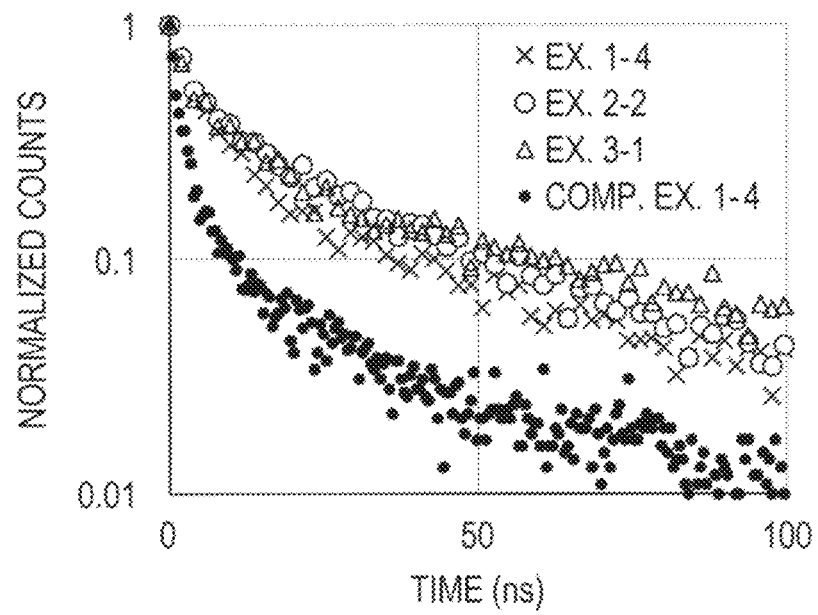
FIG. 10 illustrates fluorescence attenuation curves of the photoelectric conversion films of EXAMPLE 1-4, EXAMPLE 2-2, EXAMPLE 3-1 and COMPARATIVE EXAMPLE 1-4.

The carrier life in the photoelectric conversion films of EXAMPLES and COMPARATIVE EXAMPLE was determined from fluorescence attenuation curves. Using a near-infrared fluorescence lifetime measuring device (C7990 manufactured by Hamamatsu Photonics K.K.), the FAPbI$_3$ film formed on the glass substrate was analyzed to measure the fluorescence lifetime. A laser beam was incident on the FAPbI$_3$ film side under conditions of an excitation wavelength of 840 nm, an excitation output to the sample of less than or equal to 50 mW, and a peak count of 1000. The fluorescence attenuation curve measurement was performed for the photoelectric conversion films of EXAMPLE 1-4, EXAMPLE 2-2, EXAMPLE 3-1 and COMPARATIVE EXAMPLE 1-4. FIG. 10 illustrates the fluorescence attenuation curves of the photoelectric conversion films of EXAMPLE 1-4, EXAMPLE 2-2, EXAMPLE 3-1 and COMPARATIVE EXAMPLE 1-4. In FIG. 10, the abscissa is the time and the ordinate the normalized count.

From the fluorescence attenuation curve, lifetimes $\tau_1$ (including the laser light component) and $\tau_2$ were determined by two-component analysis:

$$A = A_1 \exp(-t/\tau_1) + A_2 \exp(-t/\tau_2)$$

Here, A, $A_1$ and $A_2$ denote the fluorescence intensity and the intensities of respective components, and t represents the time. The first component $A_1 \exp(-t/\tau_1)$ included the superimposed pulse of the time waveform of the laser used for excitation. Thus, the carrier lifetimes were compared using the lifetime $\tau_2$ of the second component $A_2 \exp(-t/\tau_2)$. The calculation results are described in Table 2.

Figure 11:
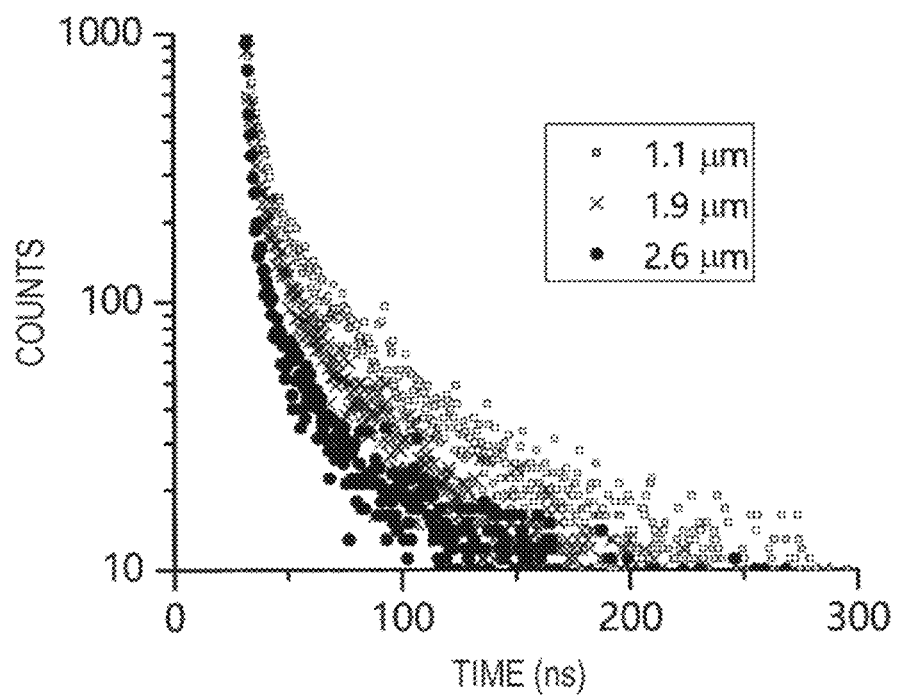
FIG. 11 illustrates fluorescence attenuation curves of photoelectric conversion films of COMPARATIVE EXAMPLES 1-2 to 1-4 having different film thicknesses from one another.

Fluorescence attenuation curves were also measured for the photoelectric conversion films of COMPARATIVE EXAMPLES 1-2 and 1-3. FIG. 11 illustrates the fluorescence attenuation curves of the photoelectric conversion films of COMPARATIVE EXAMPLES 1-2 to 1-4 having different film thicknesses from one another. From the results shown in FIG. 11, the photoelectric conversion films of COMPARATIVE EXAMPLE 1 had a shorter carrier life with increasing film thickness, and the carrier life was 40 ns when the film thickness was 2.6 μm. Provided that a photoelectric conversion film includes FAPbI$_3$ as a principal component and the carrier life is about 30 ns, the optimum film thickness of the photoelectric conversion film that will allow for the collection of generated carriers is about 500 nm at the largest. Thus, even when the photoelectric conversion films fabricated by the method of COMPARATIVE EXAMPLE are increased in film thickness to absorb more light, the carriers generated in the photoelectric conversion films cannot be taken out from the electrode layers. Further, if the root mean square roughness Rq exceeds 300 nm, it becomes difficult to form an electrode layer on top of the photoelectric conversion film, and consequently it becomes difficult to fabricate a perovskite solar cell.

In contrast, the photoelectric conversion films of EXAMPLE 1 and EXAMPLE 2 which had a film thickness of about 3 μm attained a carrier life of 110 ns and 120 ns, respectively. From these results, the photoelectric conversion films of EXAMPLES 1 and 2, in spite of being thick, had a carrier life approximately two times as long as that of the conventional films.

TABLE 1

|  |  | Substrate heating temperature [° C.] | FAPbI$_3$ concentration [mol/L] in second solution | Amount of time [s] of contact of seed layer with second solution | Film thickness H [μm] | Root mean square roughness Rq [μm] | Rq/H |
| --- | --- | --- | --- | --- | --- | --- | --- |
| EXAMPLE 1 | 1-1 | 85 | 1.3 | 1 | 2.33 | 0.24 | 0.10 |
|  | 1-2 | 95 | 1 | 1 | 2.05 | 0.16 | 0.08 |
|  | 1-3 | 100 | 1 | 1 | 3.97 | 0.24 | 0.06 |
|  | 1-4 | 100 | 0.9 | 1 | 3.05 | 0.22 | 0.07 |
|  | 1-5 | 100 | 0.8 | 1 | 2.28 | 0.23 | 0.10 |
|  | 1-6 | 135 | 0.69 | 1 | 2.42 | 0.22 | 0.09 |
|  | 1-7 | 155 | 0.62 | 1 | 2.61 | 0.28 | 0.11 |
| EXAMPLE 2 | 2-1 | 100 | 1 | 1 | 3.67 | 0.28 | 0.08 |
|  | 2-2 | 100 | 0.9 | 1 | 2.83 | 0.23 | 0.08 |
|  | 2-3 | 100 | 0.8 | 1 | 2.78 | 0.36 | 0.13 |
| EXAMPLE 3 | 3-1 | 100 | 1 | 1 | 3.12 | 0.24 | 0.08 |
|  | 3-2 | 100 | 1 | 3 | 3.21 | 0.30 | 0.09 |
|  | 3-3 | 100 | 1 | 10 | 2.91 | 0.27 | 0.09 |
|  | 3-4 | 100 | 1 | 30 | 5.15 | 0.48 | 0.09 |
| COMPARATIVE EXAMPLE 1 | 1-1 | — | 1.5 | — | 0.64 | 0.23 | 0.36 |
|  | 1-2 | — | 2 | — | 1.06 | 0.38 | 0.36 |
|  | 1-3 | — | 2.5 | — | 1.88 | 0.47 | 0.25 |
|  | 1-4 | — | 3 | — | 2.61 | 0.67 | 0.26 |

TABLE 2

|  | Film thickness [μm] | Carrier life [ns] |
| --- | --- | --- |
| EXAMPLE 1-4 | 3.05 | 110 |
| EXAMPLE 2-2 | 2.83 | 120 |
| EXAMPLE 3-1 | 3.12 | 110 |
| COMPARATIVE EXAMPLE 1-4 | 2.61 | 34 |

From the above results, the photoelectric conversion films of EXAMPLES may be formed with a film thickness of greater than or equal to 1 μm to increase the amount of light absorption while still ensuring that the generated carriers can be taken out through the electrode layers. Thus, the photoelectric conversion films may be used for the fabrication of highly efficient solar cells.

As described hereinabove, the photoelectric conversion films of the present disclosure can absorb light in an increased band as a result of having a large film thickness of greater than or equal to 1 μm. This thickening of the films is feasible while ensuring that the increase in surface roughness and the consequent decrease in carrier life are both small. Thus, the photoelectric conversion films of the present disclosure are photoelectric conversion films suited for the fabrication of highly efficient solar cells.

The photoelectric conversion film of the present disclosure can concurrently attain a high light absorption ability and a long carrier life, and thus may be used as a photoelectric conversion layer in a highly efficient solar cell.

REFERENCE SIGNS LIST

10 SUBSTRATE
11 SEED LAYER
12 PHOTOELECTRIC CONVERSION FILM
51 FIRST SOLUTION
52 SECOND SOLUTION
101 SUBSTRATE
102 FIRST ELECTRODE
103 PHOTOELECTRIC CONVERSION LAYER
104 SECOND ELECTRODE
105 ELECTRON TRANSPORT LAYER
106 HOLE TRANSPORT LAYER
100, 200, 300 SOLAR CELLS

What is claimed is:

1. A photoelectric conversion film comprising:
a perovskite compound including a monovalent formamidinium cation, a Pb cation and an iodide ion,
the photoelectric conversion film having a film thickness of greater than or equal to 2.05 μm,
the ratio of root mean square roughness Rq to the film thickness being less than or equal to 0.13 and greater than or equal to 0.07.

2. The photoelectric conversion film according to claim 1, wherein
the film thickness is less than or equal to 5.2 μm.

3. The photoelectric conversion film according to claim 1, wherein
the ratio of root mean square roughness Rq to the film thickness is less than or equal to 0.1.

4. A solar cell comprising:
a first electrode;
a second electrode; and
a photoelectric conversion layer disposed between the first electrode and the second electrode, wherein
at least one electrode selected from the group consisting of the first electrode and the second electrode has translucency, and
the photoelectric conversion layer is the photoelectric conversion film described in claim 1.

5. The solar cell according to claim 4, further comprising an electron transport layer disposed between the first electrode and the photoelectric conversion layer.

6. The solar cell according to claim 4, further comprising a hole transport layer disposed between the second electrode and the photoelectric conversion layer.

7. A method for producing a photoelectric conversion film, comprising:
(A) bringing a first solution including elements for constituting a first precursor perovskite compound into contact with a substrate, and heating the substrate to form a seed layer including the first precursor perovskite compound; and
(B) heating the substrate and a second solution, and bringing the surface of the second solution into contact with the surface of the seed layer on the substrate to precipitate a second perovskite compound, thereby producing the photoelectric conversion film of claim 1.

* * * * *